United States Patent [19]

Ayata et al.

[11] Patent Number: 4,553,834
[45] Date of Patent: Nov. 19, 1985

[54] MASK ALIGNER HAVING A MALFUNCTION DISPOSAL DEVICE

[75] Inventors: Naoki Ayata, Machida; Tadashi Konuki, Tokyo, both of Japan

[73] Assignee: Canon Kabushiki Kaisha, Tokyo, Japan

[21] Appl. No.: 554,633

[22] Filed: Nov. 23, 1983

[30] Foreign Application Priority Data

Dec. 1, 1982 [JP] Japan .................. 57-210986

[51] Int. Cl.[4] ............................. G03B 27/42
[52] U.S. Cl. ...................... 355/53; 355/86; 355/95; 364/184; 364/490
[58] Field of Search .......... 355/43, 45, 14 C, 53, 355/86, 95; 364/184, 490; 356/399–401; 250/237 G; 340/825.16

[56] References Cited

U.S. PATENT DOCUMENTS

| 3,955,072 | 5/1976 | Johannsmeir et al. | 355/86 X |
| 4,199,219 | 2/1981 | Suzki et al. | 350/91 |
| 4,251,129 | 2/1981 | Suzki et al. | 350/6.1 |
| 4,340,965 | 7/1982 | Beckman et al. | 364/184 X |
| 4,425,037 | 1/1984 | Hershel et al. | 355/53 X |

Primary Examiner—Russell E. Adams
Assistant Examiner—Della Rutledge
Attorney, Agent, or Firm—Fitzpatrick, Cella, Harper & Scinto

[57] ABSTRACT

A mask aligner for aligning a wafer with a mask and exposing the wafer to an image of the mask, includes an illumination source for illuminating the mask, plural devices for executing plural functions of the aligner, a controller for controlling operation of the apparatus in accordance with a predetermined routine, a detector for automatically detecting a malfunction, a memory of plural routines for disposing of one kind of malfunction; a selector for manually selecting one of the routines; and another controller for controlling the apparatus in accordance with the selected routine, when the detector detects a malfunction.

17 Claims, 3 Drawing Figures

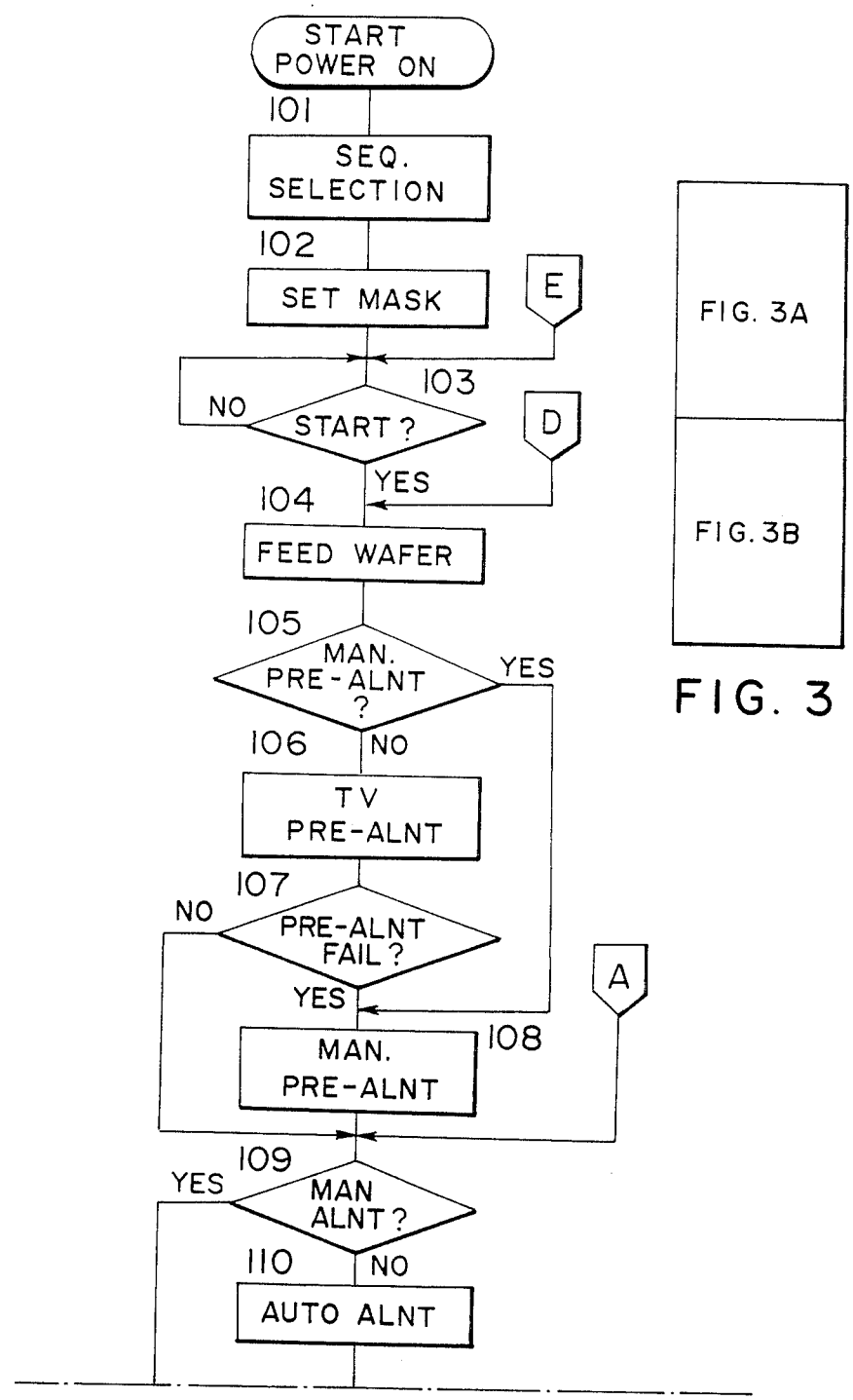

MASK ALIGNER HAVING A MALFUNCTION DISPOSAL DEVICE

BACKGROUND OF THE INVENTION

1. Field of the Invention

The present invention relates to a mask aligner for semiconductor manufacturing alignment and exposure apparatus, and more particularly to a mask aligner having a malfunction disposal device.

2. Description of the Prior Art

It is known that an alignment mark of a mask (original) and that of a wafer (radiation sensitive, such as photosensitive) can be automatically aligned in the field of the alignment and exposure apparatus for manufacturing semiconductor circuits, as disclosed in U.S. Pat. Nos. 4,199,219, 4,251,129 and others. In operation of such automatic alignment devices, it is possible that the automatic operation is disabled by an erroneous detection of the mark, or the like, which may be caused by dust attached to the mask or wafer surface. Heretofore, upon the occurrence of such a malfunction, the machine is stopped as it is, and produces a warning to the operator of the error occurrence.

It is not always assured, however, that the operator is present at the machine whenever the malfunction takes place. So, there may be a time loss from the error occurrence to the arrival of the operator, which can be a serious problem. In the whole surface exposure system which is widely used at present and which exposes the whole surface of the wafer to the pattern of the mask by one shot, the occurrence of disabled alignment prevents the process from proceeding to the next step, so that the loss of time is not completely avoidable. On the contrary, in a TTL alignment step-and-repeat type alignment and exposure apparatus wherein the alignment is effected shot by shot (die by die), the process can go forward as the case may be, despite a malfunction, so that the above loss of time is serious in that it may lead to an avoidable low throughput.

SUMMARY OF THE INVENTION

Accordingly, the principal object of the present invention is to provide an apparatus wherein, upon occurrence of malfunction, the appropriate manner of disposing thereof can be selected out of plural manners in dependence on the situation, so that effective and efficient disposal or recovery can be made.

The second object of the present invention is to provide an apparatus which has effective error disposal routines to allow immediate start of the subsequent operation so that the above described loss of time can be minimized, thus increasing the throughput.

The third object of the present invention is to provide an apparatus which does not require complicated operations to dispose of the error, upon its occurrence, so that unskilled operators can attend to the apparatus.

The fourth object of the present invention is to provide a step-and-repeat type aligner including means for detecting the occurrence of a malfunction and interrupting the control of the routine which is being executed at that time, memory means having plural manners of disposal for the same malfunction, means for selecting one of the manners, and means for operating the aligner in accordance with the selected manner.

As an example of the disposal at the time of the alignment error in the automatic alignment operation (which may be the non-convergence of the alignment operation), the aligner may have a first operational mode wherein the automatic alignment operation is interrupted, and a warning is produced, and a second mode wherein the die for which the alignment failed is skipped, and the process goes to the next die. These two modes are stored in the memory. When the operator is in front of the machine so that he can immediately attend to the malfunction upon the occurrence thereof, the first mode is selected. When, on the other hand, the operator is away so that immediate attention cannot be expected, the second mode is selected. Thus, the effective and efficient disposal of a malfunction or error can be made possible.

In the case of the second mode selected, the warning of the alignment error is made, and the identification of the skipped die or short is indicated, when the exposures for the one wafer finish or when the error occurs. The operator may well carry out then, for example, manual alignment for the particular die. This can be a subordinate mode 2A of the second mode. Otherwise, the step can go to the next wafer (at the cost of the chips in the skipped die), while the skipped die is memorized. This will work when a large number of chips must be manufactured in short time, or when the machine goes without an operator. This can be a subordinate mode 2B of the second mode.

Those error disposals achieve the efficient exposure operation with minimum time loss.

These and other objects, features and advantages of the present invention will become more apparent upon a consideration of the following description of the preferred embodiment of the present invention taken in conjunction with the accompanying drawings.

DESCRIPTION OF THE PREFERRED EMBODIMENT

Figure 1:
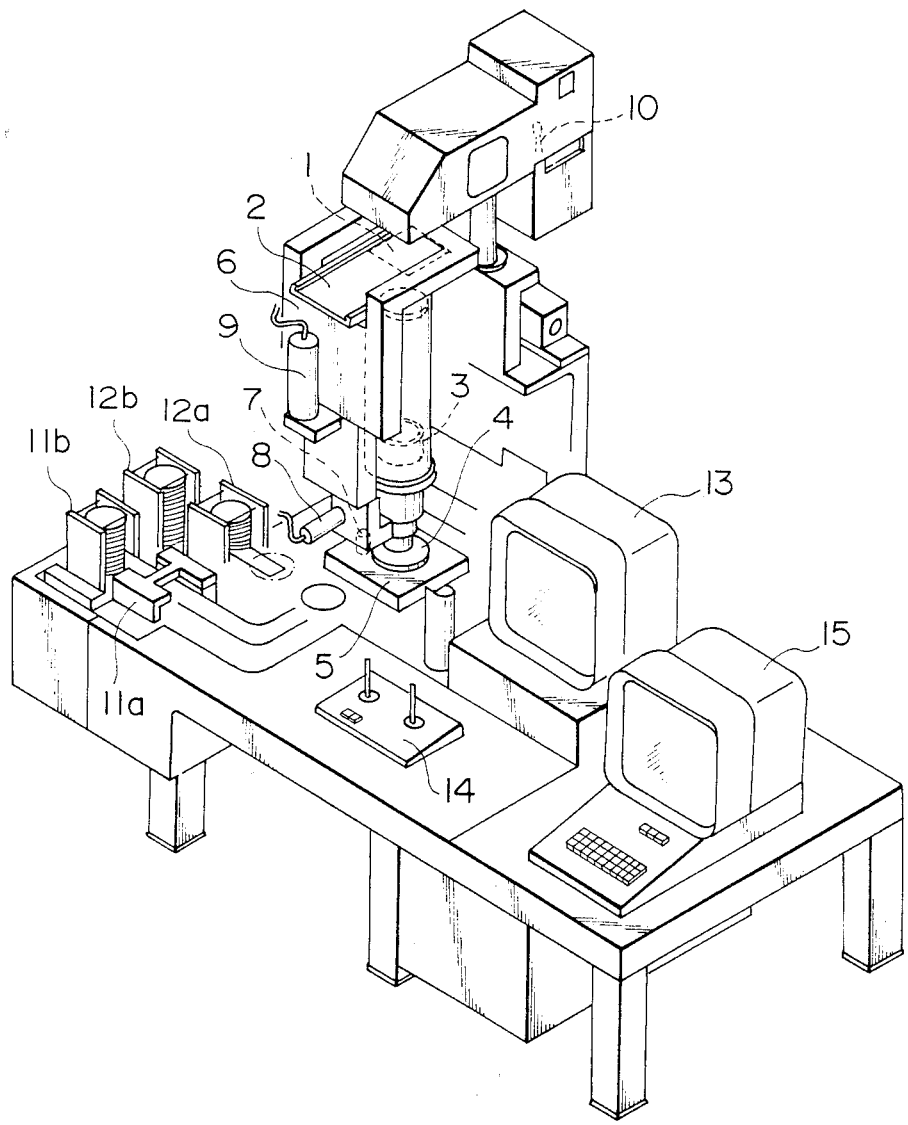
FIG. 1 is a perspective view of the alignment and exposure apparatus according to an embodiment of the present invention.

An embodiment of the present invention will be described in conjunction with the accompanying drawings, wherein FIG. 1 shows a stepper type alignment and exposure apparatus. A mask is placed on a mask stage 2 which is movable in the X direction, the Y direction and the $\theta$ direction. Under the mask stage 2 there is a wafer 4 exposed through a projection lens 3. The wafer 4 is placed on the wafer stage 5 which is movable in the X direction, the Y direction and the $\theta$ direction. A housing 6 of the apparatus accommodates a TTL alignment scope and an observation alignment scope. The apparatus includes an objective lens 7 for a TV alignment, which forms an image, that is then transmitted to a TV pre-alignment image pick-up device and picked-up thereby. The apparatus further includes an image pick-up tube 9 for observing the wafer 4 through the exposure lens 3; illumination source 10 for illuminating the mask 1; wafer carrier 11a and 11b for supplying the wafers 4; wafer collecting carrier 12a and 12b; a monitor TV 13 for displaying the image selectively through the pre-alignment image pick-up tube 8 and TTL image pick-up tube 9; operation panel 14 having control-sticks and switches; and a console 15 for controlling the apparatus in response to the CRT display.

The control-sticks on the operation panel 14 can control plural functions, for example, X direction movement, Y direction movement and θ direction movement of the mask stage 2 and the wafer stage 5, and further X direction movement, Y direction movement and Z direction (the direction of the focusing direction) movement and zooming operation of the unshown alignment scope provided above the mask 1. Those functions are automatically selected, by suitably presetting the mode so as to be matched to the current step of the sequence which is being performed. More particularly, before the start, the mask stage 2 and the alignment scope are driven; after the pre-alignment and automatic alignment, the wafer stage 5 can be driven.

Figure 2:
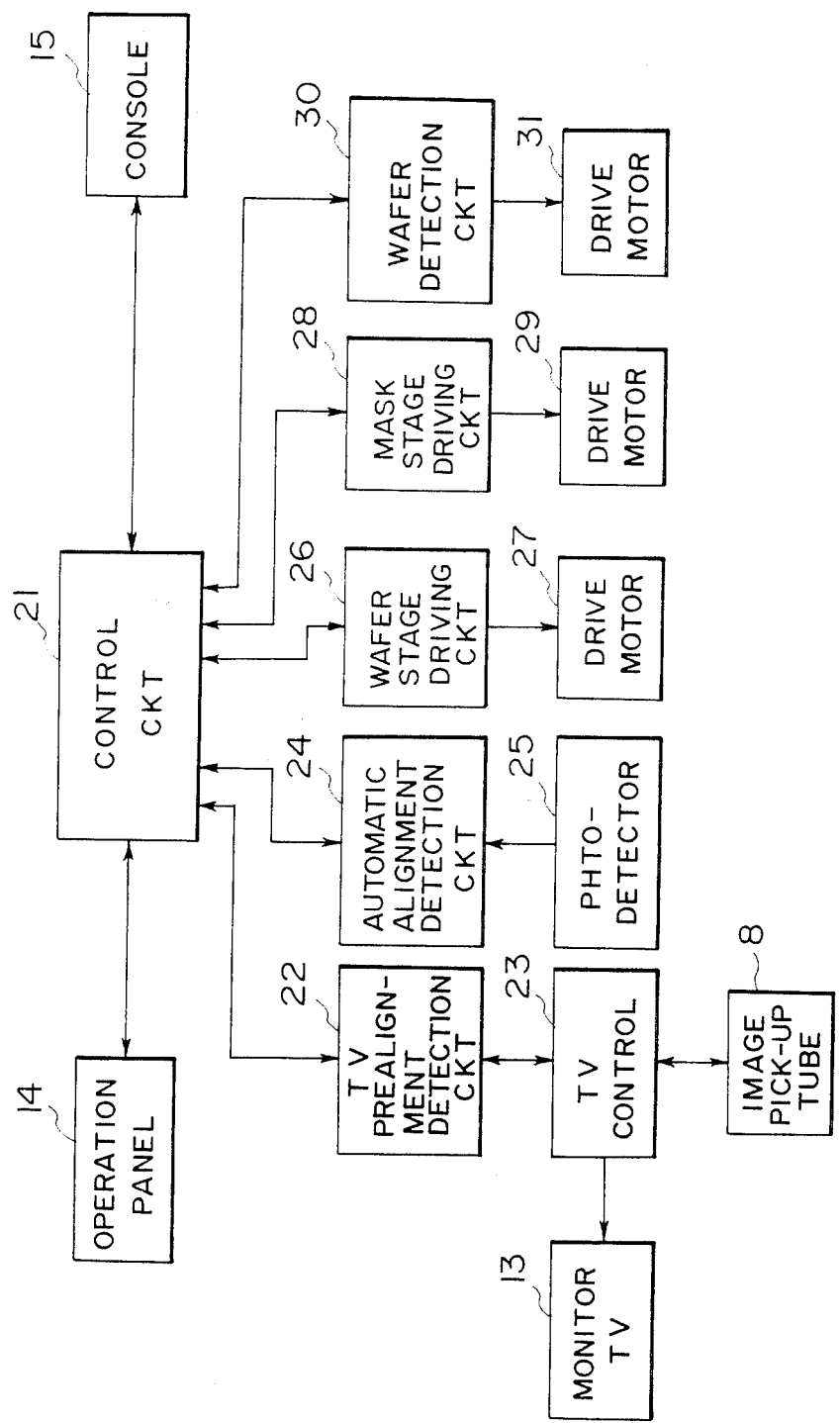
FIG. 2 is a block diagram of a control device for the apparatus of FIG. 1.

FIG. 2 is a block diagram of a control device for interrelating the associated parts of the exposure apparatus of FIG. 1. It includes the control and memory circuit 21 having a microprocessor with a memory, which communicates with, i.e., receives signals from and transmits signals to, the various operation mechanisms and driving circuits to control the entire operation of the alignment and exposure. The major functions of the control and memory circuit 21 are:

(a) To receive signals from the operation panel 14:

(b) To communicate with the console 15:

(c) To communicate with the TV pre-alignment detection circuit 22 which is connected with the TV controller 23 to operate the TV 13 and pre-alignment image pick-up tube 8:

(d) To communicate with an automatic alignment detection circuit 24 which operates in response to the output of a photodetector 25 of the automatic alignment scope:

(e) To communicate with a wafer stage driving circuit 26 to drive a motor 27 for driving the wafer stage 5:

(f) To communicate with a mask stage driving circuit 28 to drive a motor 29 for driving the mask stage 2:

(g) To communicate with a wafer handling circuit 30 to operate the motor or motors 31 for driving the wafer supply carrier 11a and 11b and the wafer collecting carrier 12a and 12b.

Figure 3B:
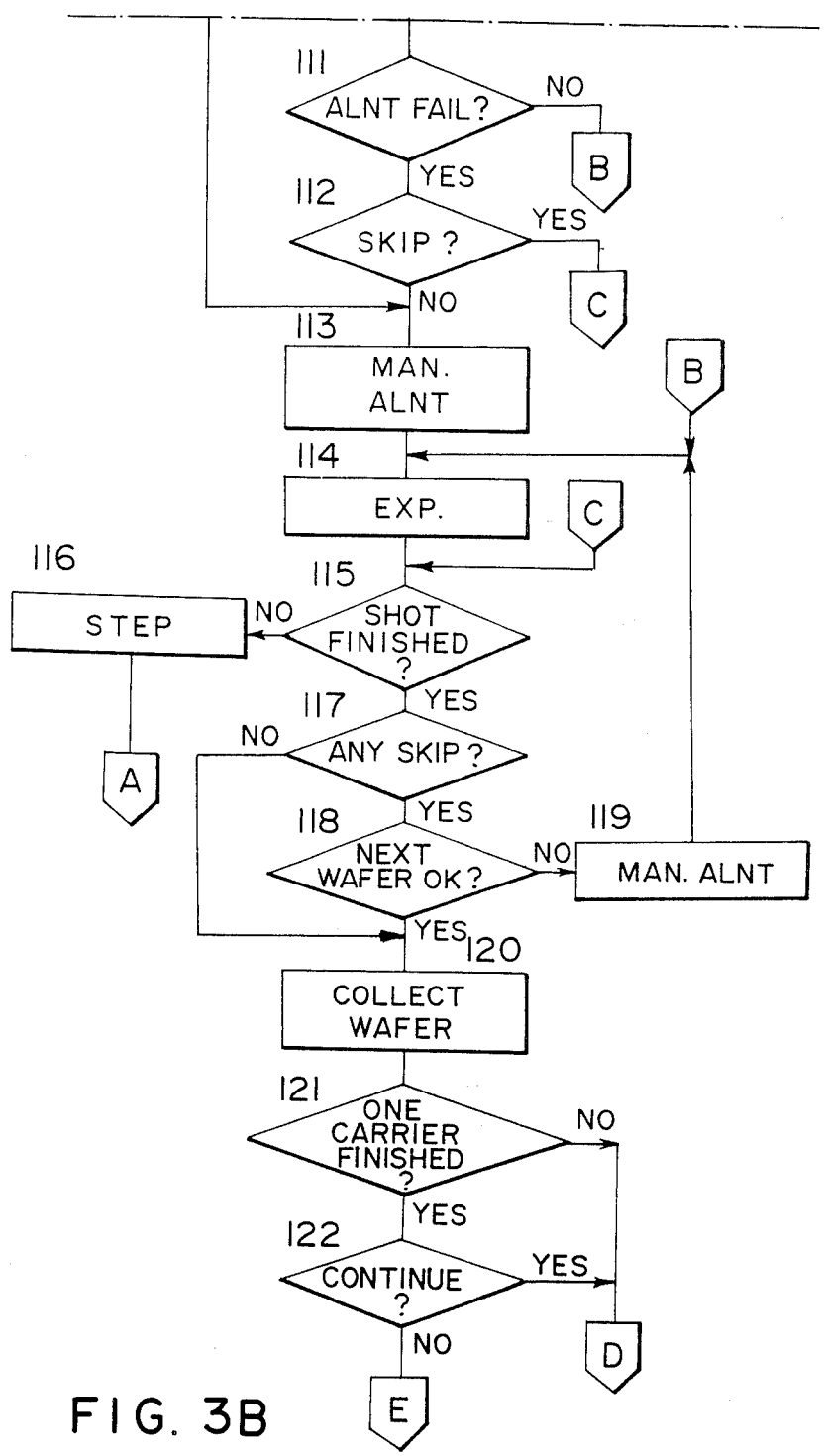
FIG. 3 shows a flowchart of the operation of the apparatus of FIG. 1 with the FIG. 2 control device.

FIG. 3 is a flowchart showing the sequence of the malfunction disposal. The sequence is programed in the control and memory circuit 21.

After the main switch is turned on, the selection of the sequence is inputted by the console 15 at step 101. The selections to be made are:

(1) As to whether the function of pre-alignment is to be performed by the TV pre-alignment (automatic) or whether it is to be manually performed (step 105):

Here, the TV pre-alignment means the pre-alignment wherein an image of the alignment pattern on the wafer 4 surface is picked up by the TV pre-alignment circuit 22, the TV controller 23 and the image pick-up tube 8 to display the pattern on the monitoring TV and to process the video signals to determine the position of the pre-alignment mark provided at a predetermined position of the wafer. Then, the wafer 4 is moved to the wafer stage 5 in consideration of the detected position and the distance between the TV pre-alignment position and the exposure position, thus pre-aligning the wafer at the exposure position.

(2) As to whether the function of the alignment between the mask 1 and the wafer 4 is to be automatically performed or whether it is to be manually done (step 109):

(3) As to whether, upon the occurrence of the alignment error or failure, the function of skipping the shot and proceeding to the next shot is to be executed, or whether it is to be manually disposed of (step 112):

(4) As to whether, when the shot is skipped by the selection of the above item (3), the step is to go to the next wafer, neglecting the skipped shot, at the end of the shots for the wafer except for the skipped shot, or whether the step is to go back to the skipped shot, for the manual alignment for the skipped die (step 117).

Among the four selections, the third and fourth selections are related to the present invention, that is, the disposal of the malfunction. The third selection corresponds to the above described first and second modes, and the fourth selection corresponds to the subordinate modes 2A and 2B.

Those selections can be made for all of the wafer and/or all of the shots indiscriminately, and also it is possible to make different selections for a particular wafer.

The sequence selection can be made on the console 15 in a so-called menu fashion. Therefore, for the third selection, "SKIP" and "MANUAL ALIGNMENT" are indicated on the CRT display, so that either of them can be selected by a cursor. The sequence selection is not necessarily limited to the console operation, but can be made by selector button which can be provided on the operation panel 14.

When the selections on the console 15 are finished (step 101), the control and memory circuit 21 actuates the mask stage driving circuit 28 to operate the drive motor 29, thus placing the mask 1 at the predetermined position. Then the apparatus waits for the input to the console 15 or the operation panel 14 (step 103). When the start button on the operation panel 14, or when the start is keyed in the console 15, the wafer handling circuit 30 is actuated to operate the drive motor 31, thus supplying the wafer 4 from the supply carriers 11a and 11b to the wafer stage 5 (step 104). Then, the wafer stage driving circuit 26 is actuated to operate the drive motor 27. By this, the wafer stage 5 carrying the wafer 4 feeds the wafer 4 to a predetermined position so as to bring the TV alignment mark on the wafer 4 within the field of view of the TV alignment objective lens 7.

Then, the preselection for the above-described first selection is discriminated. If the TV pre-alignment has been selected, the TV pre-alignment is executed (step 106). The TV pre-alignment operation determines the deviation of the coordinates of the TV pre-alignment mark from the center of the field, and the deviation is taken into account for the amount of movement from the TV pre-alignment position to the TTL alignment position by the wafer stage 5, so as to compensate for the deviation. If, for example, the pre-alignment mark is outside the view field of the image pick-up tube 8, the TV pre-alignment is not possible. When this occurs (step 107), the manual alignment by the operator is automatically enabled (step 108). The control stick on the operation panel is handled by the operator to move the wafer stage 5 permitting the operator to look for the pre-alignment mark in the monitoring TV 13. If, on the other hand, the manual alignment has been selected, the step skips from step 105 to step 108 to enable the manual alignment.

When the pre-alignment is completed, the wafer stage 5 moves to a position under the exposure lens 3 through the distance determined by the distance between those positions and also by the detected deviation. Then, the so-called step and repeat operation starts, which repeats the combination of (1) step-moving the wafer stage 5 through a predetermined distance (2) aligning the mask 1 and the wafer 4 through the exposure lens 3 and (3) exposing the wafer 4 to the mask pattern through the lens 3. This is called "die by die alignment" or "shot by shot alignment". At this time, the first selection (step 101) is discriminated, i.e., as to whether the alignment of the mask 1 and wafer 4 is to be manual or whether it is to be automatic (step 109).

If the automatic alignment has been selected, the alignment operation is performed with the use of the automatic alignment detection circuit 24 and the photodetector 25 (step 110). The manner of the alignment is not limiting if it is TTL alignment. For example, the alignment operation can be effected as follows. The alignment patterns on the mask 1 and the wafer 4 are simultaneously scanned by a laser beam, which is received, after being reflected by the marks, by a photoelectric transducer, which produces signals corresponding to the alignment mark patterns. The deviation, displacement or misalignment between the alignment patterns is determined by the time intervals between the signals. The determined deviation is corrected by moving the wafer stage 5 or the mask stage 2 in accordance with the deviation. At the end of the automatic alignment sequence, it is discriminated whether or not an error or failure took place in the alignment operation. If not, the sequence goes to the exposure step (step 114). If an error occurs, the sequence goes to step 112.

The failure of automatic alignment can be caused by piece of dust on the wafer 4 or mask 1, by an erroneous detection of an alignment mark which may be given by a score on the mask 1 or wafer 4 or by an insufficient amount of light reflected by the wafer 4 surface which as been processed. Generally, however, the possibility of the alignment error is very small. When the error occurs in any event, and the sequence goes to step 112, and the discrimination is made as to whether the preselection (step 101) for the third selection is the manual alignment or whether it is the skipping of the shot for the alignment-failed die. The discrimination corresponds to the first and the second modes of the error disposal. Irrespective of which mode has been selected, the occurrence of the error or failure is made known to the operator.

If the discrimination at step 109 shows the manual alignment, the operator handles a control stick on the operation panel 14 or the keys on the console 15 to move the wafer stage 5 or the mask stage 2 to align the mask 1 and the wafer 4 (step 113). When the manual alignment (step 113) reaches the sufficient degree of alignment or when the automatic alignment is performed without failure, the sequence goes to step 114 whereat the wafer 4 is exposed to the light pattern of the mask 1.

At the end of the exposure, or when the sequence skips to step 115 as a result of the discrimination of the step 112, the discrimination is made as to whether all the shots on the wafer 4 are finished or not. If not, that is, there still remains an unexposed die, the wafer stage 5 steps to the next shot position by the drive motor 27 (step 116), then, the sequence returns to step 109 to repeat the alignment and exposure operation. When all the shots are finished, the sequence goes to step 117.

At the step 117, the discrimination is made as to whether there was any skipped shot or die on the wafer 4. If not, the wafer 4 is collected (step 120). If any, the discrimination is made as to whether the preselection is the subordinate mode 2B wherein the skipped shot is neglected, and the next wafer is brought in, or whether it is the subordinate mode 2A wherein the manual alignment is effected for the skipped die. If the manual alignment is preselected, the operator manually performs the alignment (step 119). Before the operation, the wafer stage 5 automatically returns to the skipped die, and the manual alignment by the control stick on the operation panel 14 is enabled. After the manual alignment is completed, the die is exposed to the mask pattern (step 114). If plural shots have been skipped, the above steps are repeated until all the skipped shots are recovered. At the end thereof, the wafer 4 is collected by driving the drive motor 31 (step 120), the exposed wafer 4 is collected on the wafer collecting carriers 12a and 12b.

At step 121, the discrimination is made as to whether all the wafers on the carrier have been exposed. If not, the sequence goes back to step 104 to expose the next wafer 4. If all the wafers from the one carrier have been processed, the discrimination is made as to whether or not the double carrier is used to continue the operation. If so, the sequence goes back to the step 104 to expose the wafers 4 on another carrier. If not, the sequence goes back to the step 103 to wait for restart.

In the foregoing embodiment, the manner of disposing of the failure has been described with respect to the four selections, namely first, second, third and fourth selections which have been made prior to the start of operation. It is not always necessary to previously select the manner of failure disposal, but it is a possible alternative to interrupt the operation upon the occurrence of the failure and warn the operator, simultaneously with allowing the selection of the manners on such an occasion.

The present invention is not limited to the alignment failure, but applicable to the other errors, such as the failure in the movement of the wafer stage 5 and the failure in the detection of the automatic focusing of the exposure lens 3, and the like failures. The lens 3, for example, must be controlled in its position relative to the wafer stage 5 in the direction of its optical axis to be focused right on the wafer 4. The measurement of the distance between the exposure lens 3 and the wafer stage 5 can fail. The measurement is generally effected by, for example, an air micrometer wherein the air is blown through a nozzle to an object, and the distance between the nozzle and the object is determined by the back pressure. Four of such pneumatic sensors are fixed on the exposure lens 3 barrel with the nozzles faced to the wafer 5 so that the clearance between the lens and the wafer 4 are measured at the four different points. When one, for example, out of the four sensors fails, there are plural ways of disposal. As an example, the measurement can be interrupted to wait for the operators fixing operations, or the measurement can be continued with the remaining three sensors. One out of those two modes can be selected by the operator.

As described in the foregoing, the aligner according to the present invention has means for selecting the way of disposing of the malfunction, so that efficient and effective disposal of the failure is made possible.

While the invention has been described with reference to the structures disclosed herein, it is not confined to the details set forth and this application is intended to cover such modifications or changes as may come within the purposes of the improvements or the scope of the following claims.

What is claimed is:

1. An exposure apparatus for exposing a radiation-sensitive member to a pattern of an original, comprising:
   means for illuminating the original in order to expose the radiation-sensitive member;
   means for operating said exposure apparatus, including said illuminating means, in accordance with a predetermined sequence;
   means for automatically detecting a malfunction of said exposure apparatus;
   memory means for storing plural manners, for one kind of malfunction, of disposing of the malfunction;
   selector means for selecting one of the manners of disposing of the malfunction, prior to start of operation of said exposure apparatus by said operating means; and
   means for controlling said operating means in the manner selected by said selector means when said detecting means detects the malfunction.

2. An apparatus according to claim 1, wherein said operating means includes plural executing means for executing different functions of the apparatus, and said disposing means controls the functions, respectively.

3. An apparatus according to claim 2, wherein one of said executing means executes a function of adjusting the positional relationship between the original and the radiation-sensitive member.

4. An apparatus according to claim 2, wherein one of said executing means executes a function of relative step-movement between the radiation-sensitive member and the original.

5. An apparatus according to claim 1, wherein said operating means includes regular executing means for executing a function of the apparatus in accordance with a predetermined regular sequence and an auxiliary means for automatically executing a similar function, wherein one of the manners controls said auxiliary means.

6. An apparatus according to claim 5, wherein said regular executing means includes plural sensors for sensing a distance between the original and the radiation-sensitive member, and said auxiliary means measures the same with the use of a part of the sensors.

7. An apparatus according to claim 1, wherein said control means starts said controlling of said operating means upon the detection of a malfunction by said detecting means.

8. An apparatus according to claim 1, further comprising means for displaying characters representing the manners, respectively, and wherein said control means starts when said selector means selects one of the manners.

9. An apparatus according to claim 1, further comprising means for detecting the deviation between the original and the radiation-sensitive member, means for producing relative movement between the original and the radiation-sensitive member, means for driving said relative movement means in accordance with the detection of said deviation detecting means, means for observing the original and the radiation-sensitive member, means for manually controlling said relative movement means, and means for stepping the radiation-sensitive member, wherein one of the manners of disposal allows operation by said manual controlling means, and another of the manners of disposal allows operation of said relative movement producing means and said driving means without exposure of the radiation-sensitive member.

10. A mask aligner, comprising:
    a mask stage for supporting a mask;
    a wafer stage for supporting a wafer;
    means for projecting an image of the mask onto the wafer;
    detection means for detecting the degress of relative positional error between the mask and the wafer;
    driving means for producing relative movement between said mask stage and said wafer stage to adjust the positional relationship between them in accordance with detection by said detection means;
    means for observing the mask and the wafer;
    means for manually producing relative movement between the mask stage and the wafer stage;
    means for stepping said wafer stage to step-move the wafer;
    means for detecting a malfunction of said first-mentioned detection means; and
    means for selecting, prior to start of detection by said first-mentioned detection means, a routine of disposing of the malfunction detected by said malfunction detecting means from a plurality of such routines, one of such routines allowing operation of said manual means, and another of such routines allowing operation of said stepping means without operation of said driving means.

11. An apparatus, comprising:
    operating means operative sequentially;
    memory means for storing plural sequences for disposing of a malfunction of said operating means;
    means for selecting, prior to start of operation of said operating means, one of the sequences stored in said storing means; and
    means for controlling said operating means, upon occurrence of the malfunction thereof, in accordance with the sequence selected by said selecting means.

12. An apparatus according to claim 11, wherein said memory means stores at least one sequence for disposing of a malfunction which causes operation of said operating means by said controlling means to stop upon occurrence of the malfunction of said operating means.

13. An apparatus according to claim 12, wherein said operating means is operative to repeatedly execute in an alternating manner a first kind of operation and a second kind of operation to be effected relative to a predetermined result of the first kind of operation.

14. An apparatus according to claim 13, wherein said memory means stores at least one sequence for disposing of a malfunction which causes the first kind of operation of said operating means by said controlling means to resume while by-passing the second kind of operation, upon occurrence of the malfunction of said operating means with respect to the first kind of operation.

15. An apparatus according to claim 14, wherein said operating means is operative to execute the first kind of operation which adjusts the positional relation between a pattern and a member onto which the pattern is to be transferred and which executes the second kind of operation to transfer the pattern onto the member.

16. An apparatus according to claim 15, wherein said operating means is operative to repeat the position adjustment and the pattern transfer, as aforesaid, while step-moving the member relative to the pattern, to thereby form a plurality of such patterns on the member.

17. An apparatus according to claim 16, wherein said operating means is operative to form on a semiconductor wafer an integrated circuit pattern.

* * * * *